(12) United States Patent
Takahashi (10) Patent No.: US 8,993,950 B2
(45) Date of Patent: Mar. 31, 2015

(54) SOLID-STATE IMAGING DEVICE WITH PLURAL CCD REGISTERS

(71) Applicant: Kabushiki Kaisha Toshiba, Minato-ku, Tokyo (JP)

(72) Inventor: Masao Takahashi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 207 days.

(21) Appl. No.: 13/781,582

(22) Filed: Feb. 28, 2013

(65) Prior Publication Data

US 2014/0061434 A1 Mar. 6, 2014

(30) Foreign Application Priority Data

Aug. 29, 2012 (JP) ................................. 2012-188465

(51) Int. Cl.
*H01L 27/00* (2006.01)
*H01L 27/148* (2006.01)
*H04N 5/372* (2011.01)

(52) U.S. Cl.
CPC ...... *H01L 27/14806* (2013.01); *H04N 5/37213* (2013.01)
USPC ......... 250/208.1; 257/431; 348/282; 348/283

(58) Field of Classification Search
USPC .......... 257/431; 348/272, 281, 282, 283, 294, 348/295, 302, 303, 304
See application file for complete search history.

(56) References Cited

U.S. PATENT DOCUMENTS

| 6,002,146 A * | 12/1999 | Nakagawa et al. ............ 257/231 |
| 2002/0054230 A1* | 5/2002 | Chen .............................. 348/316 |
| 2008/0135885 A1* | 6/2008 | Uemura ......................... 257/239 |
| 2009/0040568 A1 | 2/2009 | Okada et al. |

FOREIGN PATENT DOCUMENTS

| JP | 2004-096252 A | 3/2004 |
| JP | 2008-022221 A | 1/2008 |
| JP | 2009-044569 A | 2/2009 |

* cited by examiner

*Primary Examiner* — Francis M Legasse, Jr.
(74) *Attorney, Agent, or Firm* — Holtz, Holtz, Goodman & Chick PC (57) ABSTRACT

In an embodiment, each of first and second pixel rows has pixels. A first transfer gate is arranged between the first and second pixel rows. Second transfer gates are arranged adjacently to odd-numbered pixels of the second pixel row, respectively. Third transfer gates are arranged adjacently to even-numbered pixels of the second pixel row, respectively. A first CCD register is arranged adjacently to the second transfer gates and third transfer gates. Fourth transfer gates are arranged adjacently to odd-numbered accumulation gates of the first CCD register. A second CCD register is arranged adjacently to the fourth transfer gates. An output portion converts transferred charges into a voltage signal. A clear gate controls draining of the charges accumulated in the first pixel row to a first drain portion. A switch gate controls draining of charges transferred in a row direction in the second CCD register to a second drain portion.

10 Claims, 8 Drawing Sheets

SOLID-STATE IMAGING DEVICE WITH PLURAL CCD REGISTERS

CROSS-REFERENCE TO RELATED APPLICATION

This application is based upon and claims the benefit of priority from the prior Japanese Patent Application No. 2012-188465, filed on Aug. 29, 2012, the entire contents of which are incorporated herein by reference.

FIELD

Embodiments described herein relate generally to a solid-state imaging device.

BACKGROUND

A CCD image sensor is used in an image reading apparatus such as a scanner as a solid-state imaging device. Time delay integration (TDI) technique can be adopted for increasing sensitivity of the CCD image sensor. According to the TDI technique, a transfer speed of charges to be transferred between pixel rows and an image scanning speed of a sensor are matched, and charges of a predetermined number of pixel rows are added so that the sensitivity is increased. When charges accumulated in two pixel rows are added for example, the sensitivity becomes twice as much.

In addition, when charges accumulated in two adjacent pixels are further added, the sensitivity is further increased. In this case, the resolution of image reading is lowered by half, but the sensitivity is further increased twice as much.

Various models of scanners from a high-speed scanner to a low-speed scanner are used practically, and various scanning speeds are adopted for the scanners. Since a time length of light incidence entering into each pixel row is shortened as the scanning speed is higher, a CCD image sensor needs to be highly sensitive. On the other hand, in a case where the scanning speed is low, an appropriate contrast may be acquired by decreasing the sensitivity rather than by increasing the sensitivity.

In a known CCD image sensor using the TDI technique, the sensitivity can be changed to become higher, but the sensitivity can not be changed to become lower. Accordingly, in a case where a CCD image sensor adopting the TDI technique for use in a high-speed scanner is used even in a low-speed scanner, in order to address lowering the sensitivity, transfer timing of charges is changed according to the scanning speed. Thus, the timing design is required to be accurate for transfer of charges so that the design load is increased.

DETAILED DESCRIPTION

According to one embodiment, a solid-state imaging device is provided. The solid-state imaging device has first and second pixel rows, a first transfer gate, second transfer gates, third transfer gates, fourth transfer gates, first and second CCD registers, an output portion, a clear gate and a switch gate.

The first pixel row includes pixels which convert incident light photoelectrically and accumulate acquired charges. The second pixel row includes pixels which convert incident light photoelectrically and accumulate acquired charges. The first transfer gate is arranged between the first pixel row and the second pixel row. The second transfer gates are arranged adjacently to odd-numbered ones of the pixels of the second pixel row, respectively. The third transfer gates are arranged adjacently to even-numbered ones of the pixels of the second pixel row. The third transfer gates are provided alternately with the second transfer gates, respectively.

The first CCD register is arranged adjacently to the second transfer gates and third transfer gates provided alternately, the a first CCD register accumulates received charges. The fourth transfer gates are arranged adjacently to odd-numbered accumulation gates of the first CCD register. The second CCD register is arranged adjacently to the fourth transfer gates. The second CCD register accumulates received charges. The output portion converts into a voltage signal charges transferred in a row direction in the first CCD register and the second CCD register. The output portion outputs the converted voltage signal. The clear gate controls draining of the charges accumulated in the first pixel row to a first drain portion. The switch gate controls draining of the charges transferred in the row direction in the second CCD register to a second drain portion.

Hereinafter, further embodiments will be described with reference to the drawings.

In the drawings, the same reference numerals denote the same or similar portions respectively.

Figure 1:
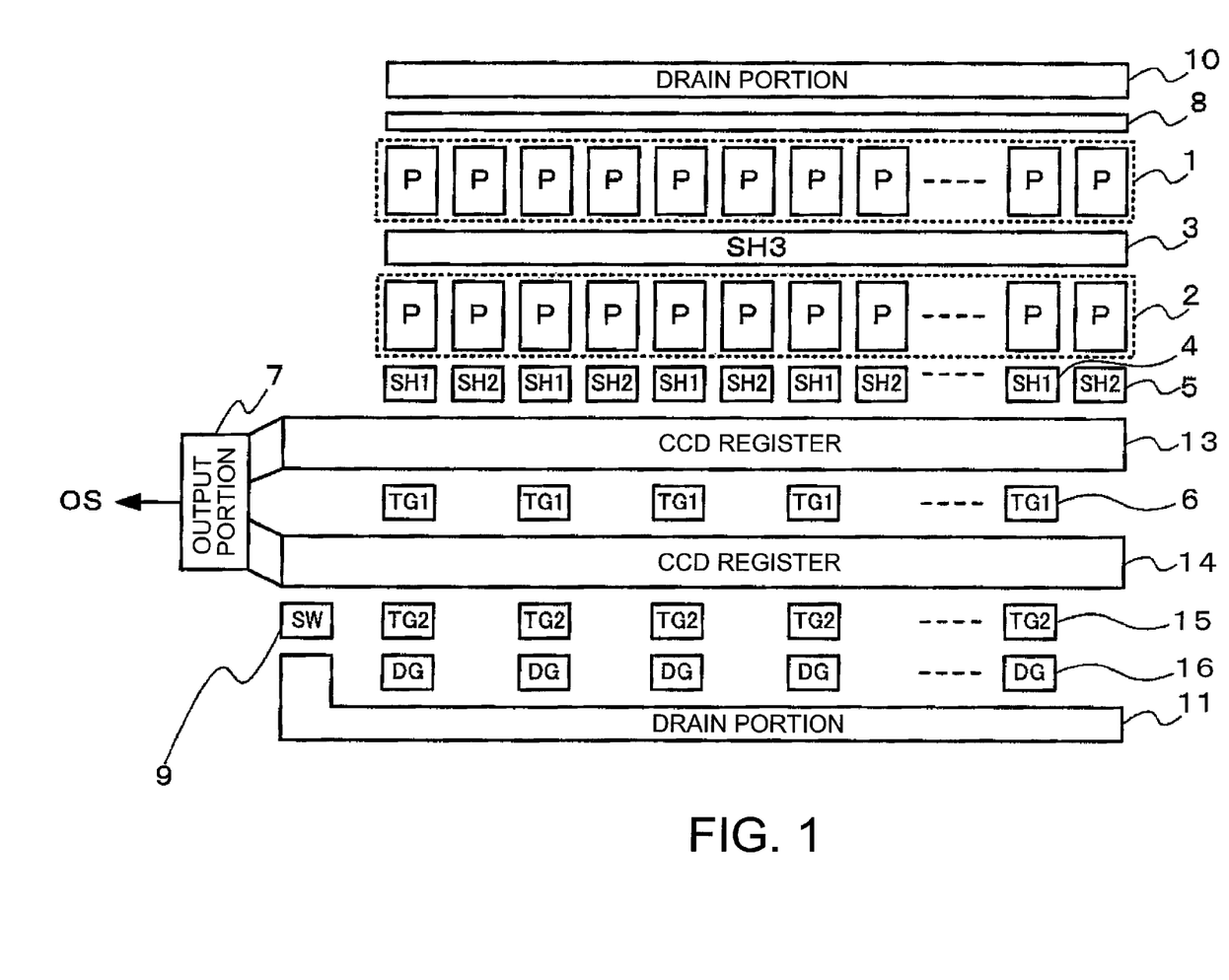
FIG. 1 is a schematic plan view showing an example of a solid-state imaging device according to an embodiment.

FIG. 1 is a schematic plan view showing an example of a solid-state imaging device according to a further embodiment.

The solid-state imaging device of the embodiment is provided with a first pixel row 1, a second pixel row 2, a gate 3 as a first transfer gate, gates 4 as second transfer gates, gates 5 as third transfer gates and a CCD register 13 as a first CCD register. Further, the solid-state imaging device is provided with gates 6 as fourth transfer gates, a CCD register 14 as a second CCD register, an output portion 7, a gate 8 as a clear gate, and a gate 9 as a switch gate. The gate may be called an SH3 gate, and the gates 4 may be called an SH1 gates. The gates 5 may be called SH2 gates, and the gates 6 may be called TG1 gates. The gate 8 may be called a CLR gate, and a gate 9 may be called an SW gate. "P" represents a pixel.

The gate 3 is arranged between the first pixel row 1 and the second pixel row 2. The gates 4 are arranged adjacently to odd-numbered pixels P of the second pixel row 2. The gates 5 are arranged adjacently to even-numbered pixels P of the second pixel row 2. The CCD register 13 is arranged adjacently to the gates 4 and the gates 5. The gates 6 are arranged adjacently to odd-numbered accumulation gates of the CCD register 13, respectively. The CCD register 14 is arranged adjacently to the gates 6. The output portion 7 converts charges transferred horizontally i.e. in a row direction by the CCD register 13 and the CCD register 14, into a voltage signal, and outputs the converted voltage signal. The gate 8 controls draining of the charges accumulated in the first pixel row 1 to a first drain portion 10. The gate 9 controls draining of the charges transferred horizontally by the CCD register 14 to a second drain portion 11.

The solid-state imaging device is provided with TG2 gates 15 and DG gates 16, as transfer gates. The TG2 gates 15 and DG gates 16 drain dark-phase charges and unnecessary charges accumulated in the CCD register 13 and the CCD register 14, to the second drain portion 11.

In the solid-state imaging device, incident light is photoelectrically converted in the first pixel row 1 and the second pixel row 2. Charges acquired by photoelectric conversion in the first pixel row 1 and the second pixel row 2 are vertically transferred to the CCD register 13 and the CCD register 14, respectively, by an on/off control of the gates 3, 4 and 6.

The charges vertically transferred to the CCD register 13 and the CCD register 14 are horizontally transferred to the output portion 7 from the CCD register 13 and the CCD register 14, respectively, and are charge-to-voltage-converted in the output portion 7. The voltage obtained by the charge-to-voltage-conversion is output as a voltage signal OS from the output portion 7.

Figure 2:
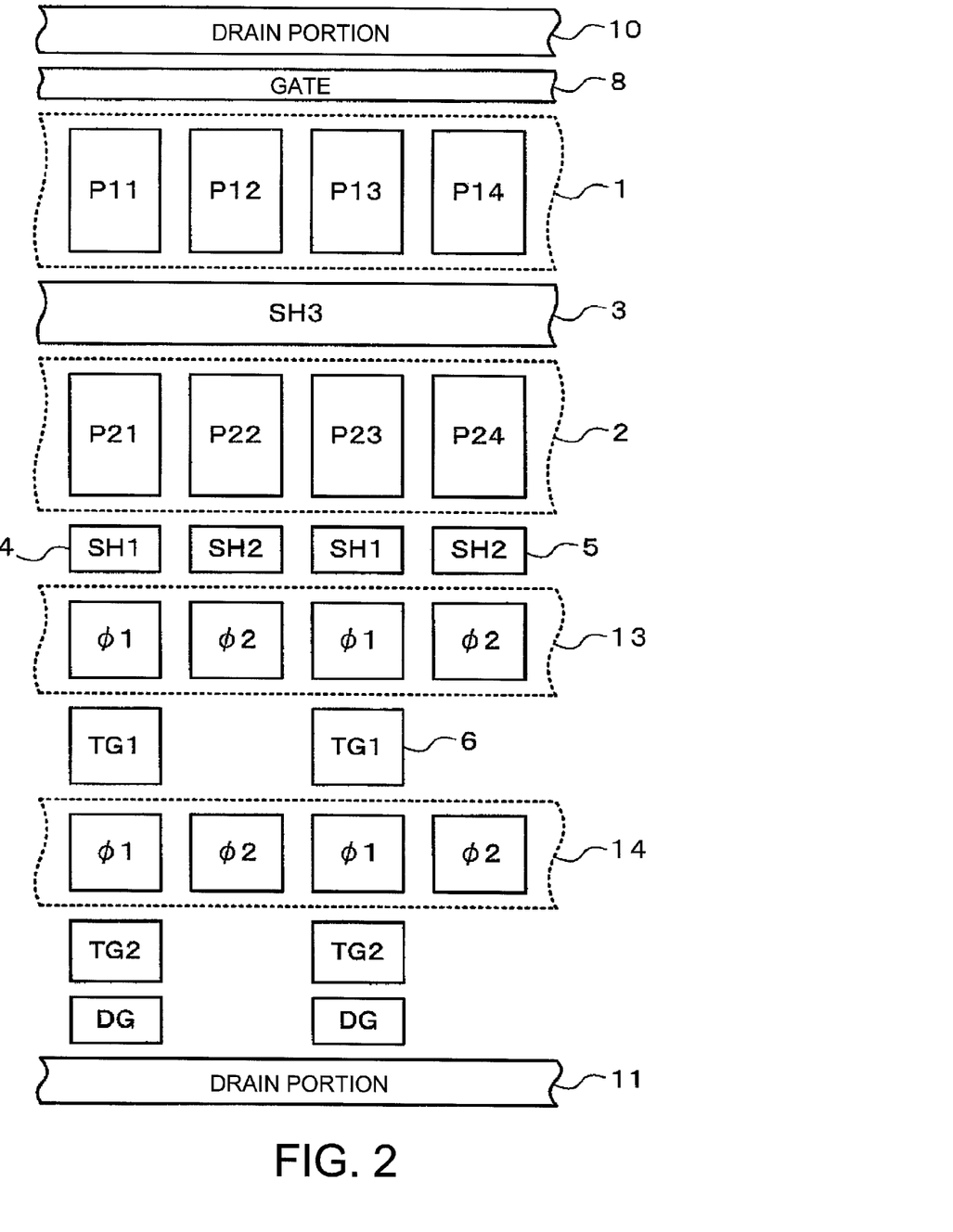
FIG. 2 is a schematic plan view showing an example of a detailed configuration of a portion associated with vertical transfer of charges in the solid-state imaging device.

FIG. 2 is a schematic plan view showing an example of a detailed configuration of a portion associated with the vertical transfer of the charges in the solid-state imaging device.

In FIG. 2, pixels . . . , P11, P12, P13, P14, . . . which are denoted as "P" in FIG. 1 are arranged in a row in the first pixel row 1.

Similarly, pixels . . . , P21, P22, P23, P24, . . . which are denoted as "P" in FIG. 1 are arranged at respective positions corresponding to the positions of the pixels of the first pixel row 1, in a row in the second pixel row 2.

The charges which correspond to a time length of light incidence are accumulated in the respective pixels of the first pixel row 1 and the second pixel row 2.

The gate 3 is arranged between the first pixel row 1 and the second pixel row 2. By controlling the gate 3, charges which are accumulated in each pixel arranged at each position of the first pixel row 1 are transferred to each pixel arranged at a corresponding position of the second pixel row 2. For example, charges accumulated in the pixel P11 are transferred to the pixel P21 and charges accumulated in the pixel P12 are transferred to the pixel P22.

The gate 8 is arranged at one of the sides (an upper side) of the first pixel row 1. When the gate 8 is at a "high" level, charges accumulated in each pixel of the first pixel row 1 are drained to the first drain portion 10.

Each gate 4 is arranged at one of the sides (a lower side) of the odd-numbered pixels . . . , P21, P23, . . . of the second pixel row 2. Each gate 5 is arranged at one of the sides (a lower side) of the even-numbered pixels . . . , P22, P24, . . . of the second pixel row 2. The gates 4 and the gates 5 are alternately arranged in a row direction.

The CCD register 13 is arranged at one of the sides (a lower side) of the gates 4 and gates 5. The CCD register 13 is configured in such a manner that accumulation portions $\phi 1$ and accumulation portions $\phi 2$ are alternately arranged. The movement of charges of the portions $\phi 1$ is controlled by a control signal $\phi 11$ described below. The movement of charges of the accumulation portions $\phi 2$ is controlled by a control signal $\phi 21$ described below.

Each accumulation portion $\phi 1$ is arranged at the one of the sides (the lower side) of the gates 4, and each accumulation portion $\phi 2$ is arranged at the one of the sides (the lower side) of the gates 5.

Accordingly, by controlling the gates 4, charges accumulated in the odd-numbered pixels of the second pixel row 2 are transferred to the accumulation portions $\phi 1$ of the CCD register 13. By controlling the gates 5, charges accumulated in the even-numbered pixels of the second pixel row 2 are transferred to the accumulation portion $\phi 2$ of the CCD register 13.

The gates 6 are arranged at one of the sides (a lower side) of the CCD register 13. The CCD register 14 is arranged at one of the sides (the lower sides) of the gates 6. In the CCD register 14, accumulation portions $\phi 1$ and accumulation portions $\phi 2$ are alternately arranged, similarly to in the CCD register 13.

The gates 6 are arranged between the accumulation portions $\phi 1$ of the CCD register 13 and the accumulation portions $\phi 1$ of the CCD register 14.

Accordingly, in the embodiment, by controlling the gates 6, charges accumulated in each accumulation portion $\phi 1$ of the CCD register 13 can be transferred to each accumulation portion $\phi 1$ of the CCD register 14. Further, charges accumulated in each odd-numbered pixel of the second pixel row 2 can be transferred to each accumulation portion $\phi 1$ of the CCD register 14.

On the other hand, charges accumulated in each even-numbered pixel of the second pixel row 2 are transferred to each accumulation portion $\phi 2$ of the CCD register 13.

In the embodiment, the CCD register 13 can operate so as to transfer the charges transferred from each even-numbered pixel of the second pixel row 2 horizontally, and the CCD register 14 can operate so as to transfer the charges transferred from each odd-numbered pixel of the second pixel row 2 horizontally.

In a case where the gates 6 are maintained in a closed state, charges are not transferred from the accumulation portions $\phi 1$ of the CCD register 13 to the accumulation portions $\phi 1$ of the CCD register 14. In this case, charges transferred from the odd-numbered pixels of the second pixel row 2 remain in the accumulation portions $\phi 1$ of the CCD register 13.

When charges which are transferred from the even-numbered pixels of the second pixel row 2 to the accumulation portions $\phi 2$ of the CCD register 13 are transferred to the accumulation portions $\phi 1$ of the CCD register 13 in advance to add to charges accumulated in the accumulation portions $\phi 1$, the sensitivity can be twice as much. In this case, the horizontal resolution lowers by half.

In the embodiment, when the gate 8 is at a "high" level, charges accumulated in each pixel of the first pixel row 1 are drained to the first drain portion 10.

When the gate 8 is at a "low" level, the period of charge accumulation in each pixel of the first pixel row 1 is determined by a time interval i.e. a falling cycle from a falling to a subsequent falling of a signal level of the gate 3. However, when the gate 8 becomes at the "high" level during a period when the gate 3 is at a "low" level, the charges which is accumulated in each pixel of the first pixel row 1 until the gate 8 becomes at the "high" level are drained to the first drain portion 10.

In this case, the period which ranges until the gate 3 rises to a "high" level and then falls to the "low" level after the gate 8 falls to the "low" level becomes a period for accumulating charges in each pixel of the first pixel row 1.

Accordingly, by changing the timing when the gate 8 becomes at the "high" level, the time period of charge accumulation in each pixel of the first pixel row 1 can be changed. When the period of charge accumulation is shortened, the amount of accumulated charges decreases. As a result, the sensitivity of each pixel of the first pixel row 1 to the amount of an incident light is lowered. As the period of charge accumulation is shortened, the sensitivity is further lowered.

In the embodiment, by controlling the timing when the gate 8 becomes at the "high" level, the reduction amount of the sensitivity of the first pixel row 1 can be adjusted.

As to the second pixel row 2, the period of charge accumulation of each odd-numbered pixel depends on a falling cycle of each gate 4, and the period of charge accumulation of each even-numbered pixel depends on a falling cycle of each gate 5. When the falling cycles of the gates 4 and the gates 5 are shortened, the sensitivity of each pixel of the second pixel row 2 with respect to the amount of incident light is lowered.

Accordingly, the reduction amount of the sensitivity of the second pixel row 2 can be adjusted by controlling the falling cycles of the gates 4 and the gates 5.

As described above, according to the embodiment, an operation for reducing the sensitivity can be performed in a TDI operation as well as an operation for increasing the sensitivity. Hereinafter, a detailed operation for changing sensitivity will be described with reference to FIGS. 3 to 8.

The operation for changing sensitivity will be explained by dividing the operation into four following operations. These operations are that for normal resolution, that for half resolution, that for adjusting the sensitivity of the first pixel row 1, and that for adjusting the sensitivity of the second pixel row 2.
(Operation for General Resolution)

Figure 3:
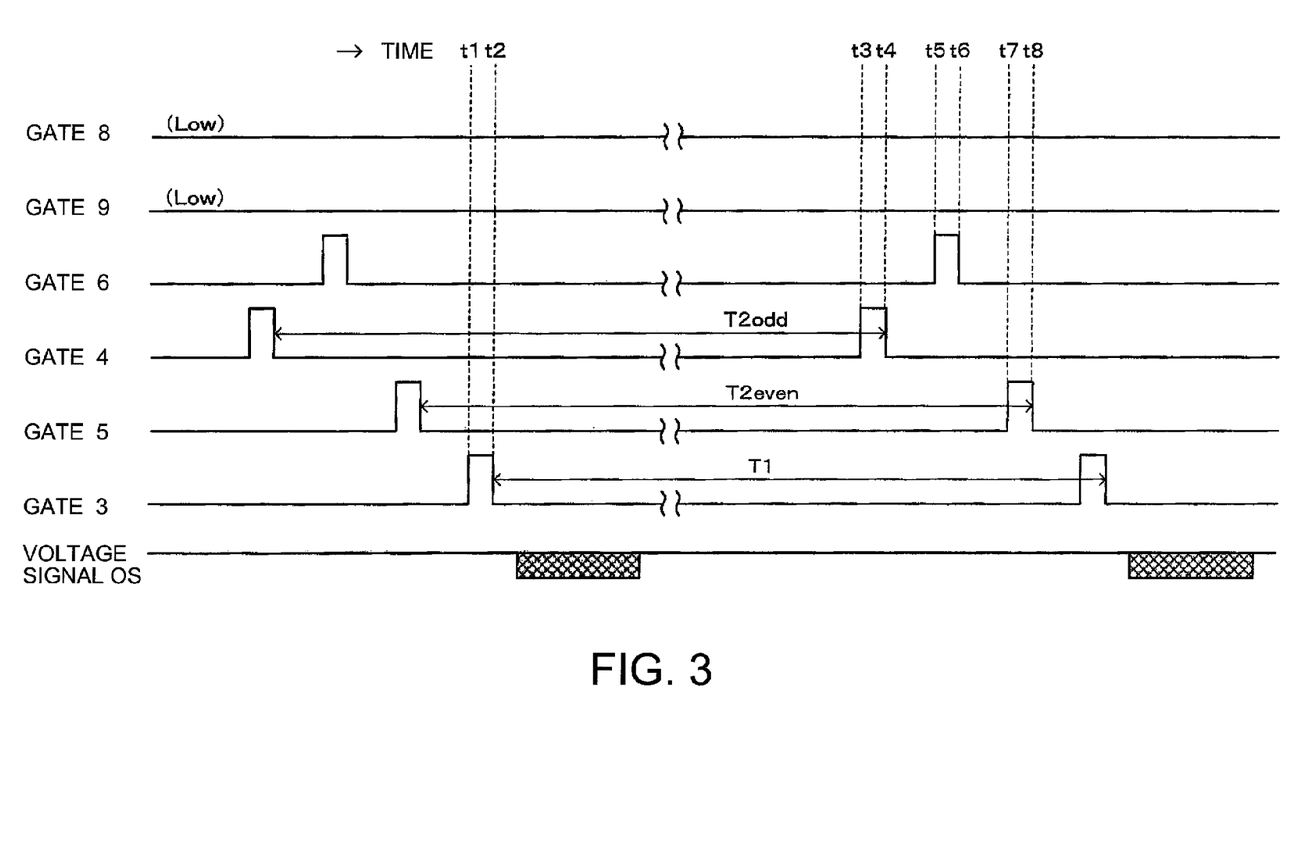
FIG. 3 is a waveform diagram for explaining a charge transferring operation for acquiring normal resolution by the solid-state imaging device.

FIG. 3 shows signal waveforms applied to the gates 3 to 6, 8, and 9 and a waveform of the voltage signal OS output from the output portion 7 during an operation for a general resolution. Specifically, FIG. 3 shows portions of the total waveforms which are repeated cyclically. The portions correspond to a period including one operation cycle of charge transfer.

In the operation for normal resolution, the gate 8 and the gate 9 shown in FIG. 1 are at a "low" level continuously. Further, the period of charge accumulation of each pixel arranged in the first pixel row 1 is set as "T1", the period of charge accumulation of each odd-numbered pixel arranged in the second pixel row 2 is set as "T2odd", and a period of charge accumulation of each even-numbered pixel of the second pixel row 2 is set as "T2even". In this case, as T1=T2odd=T2even, the sensitivities of the respective pixels of the first pixel row 1 and the second pixel row 2 become the same.

In FIG. 3, at a time t1, when the gate 3 is at a "high" level, charges accumulated in each pixel of the first pixel row 1 move to the gate 3.

At a time t2, when the gate 3 is at a "low" level, the charges which move to the gate 3 are transferred to each pixel of the second pixel row 2. As a result, the transferred charges are added to the charges accumulated in each pixel of the second pixel row 2.

At a time t3, when each gate 4 is at a "high" level, the charges of each odd-numbered pixel of the second pixel row 2 move to each gate 4.

At a time t4, when each gate 4 is at the "low" level, the charges which move to each gate 4 are transferred to each accumulation portion 41 of the CCD register 13.

At a time t5, when each gate 6 is at a "high" level, the charges of each accumulation portion $\phi 1$ of the CCD register 13 move to each gate 6.

At a time t6, when each gate 6 is at a "low" level, the charges which move to each gate 6 are transferred to each accumulation portion $\phi 1$ of the CCD register 14.

At a time t7, when each gate 5 is at a "high" level, the charges of the even-numbered pixels of the second pixel row 2 move to each gate 5.

At a time t8, when each gate 5 is at a "low" level, the charges which move to each gate 5 are transferred to each accumulation portion $\phi 2$ of the CCD register 13.

As a result, a series of vertical movements of the charges is terminated.

Figure 4:
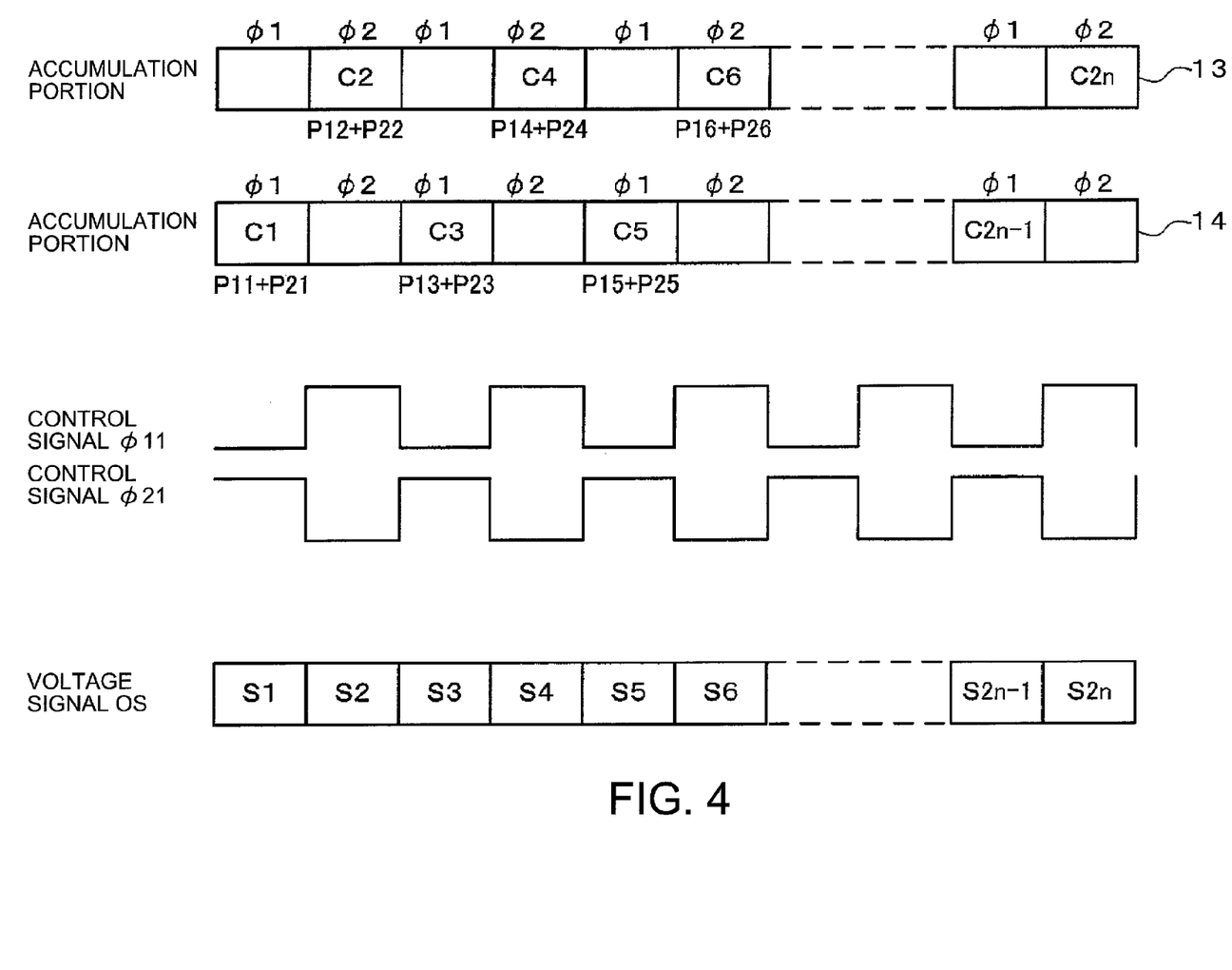
FIG. 4 is a diagram for explaining operations of first and second CCD registers and an output portion which are performed when the general resolution is acquired by the solid-state imaging device.

FIG. 4 shows a relationship among an accumulation state of the charges accumulated in the CCD registers 13, 14, the control signals $\phi 11$, $\phi 21$ and a voltage signal OS output from the output portion 7 when the vertical movement of the charges is terminated.

In the CCD register 14, the charges C1, C3, C5, ..., C2$n$−1 are accumulated in the accumulation portions $\phi 1$, respectively. In the CCD register 13, the amounts of charges C2, C4, C6, ..., C2$n$ are accumulated in the accumulation portions $\phi 2$, respectively.

The amount of charges C1 is an amount acquired by adding the charges accumulated in the pixel P11 of the first pixel row 1 and the charges accumulated in the pixel P21 of the second pixel row 2 to each other. The amount of charges C2 is an amount of charges charge acquired by adding the charges accumulated in the pixel P12 of the first pixel row 1 and the charges accumulated in the pixel P22 of the second pixel row 2.

Since the periods of charge accumulation of the respective pixels are the same (T1=T2odd=T2even) and the sensitivities are the same, the amounts of charges C1, C2 accumulated in the CCD register 14 and the CCD register 13 are twice as much as the amount of charges accumulated in each pixel. The sensitivity becomes twice as much with respect to a single pixel.

The charges which are accumulated in the CCD register 14 and the CCD register 13 are transferred horizontally by changing the control signals $\phi 11$ and $\phi 21$ alternately.

The output portion 7 charge-to-voltage-converts the charges transferred from the CCD register 14 and the CCD register 13 alternately and outputs a voltage signal OS. Specifically, the output portion 7 outputs a signal S1 obtained by converting the amount of charges C1 into a voltage, a signal S2 obtained by converting the amount of charges C2 into a voltage, ..., a signal S2$n$ obtained by converting the amount of charges C2$n$ into a voltage, sequentially.
(Operation for Half Resolution)

Figure 5:
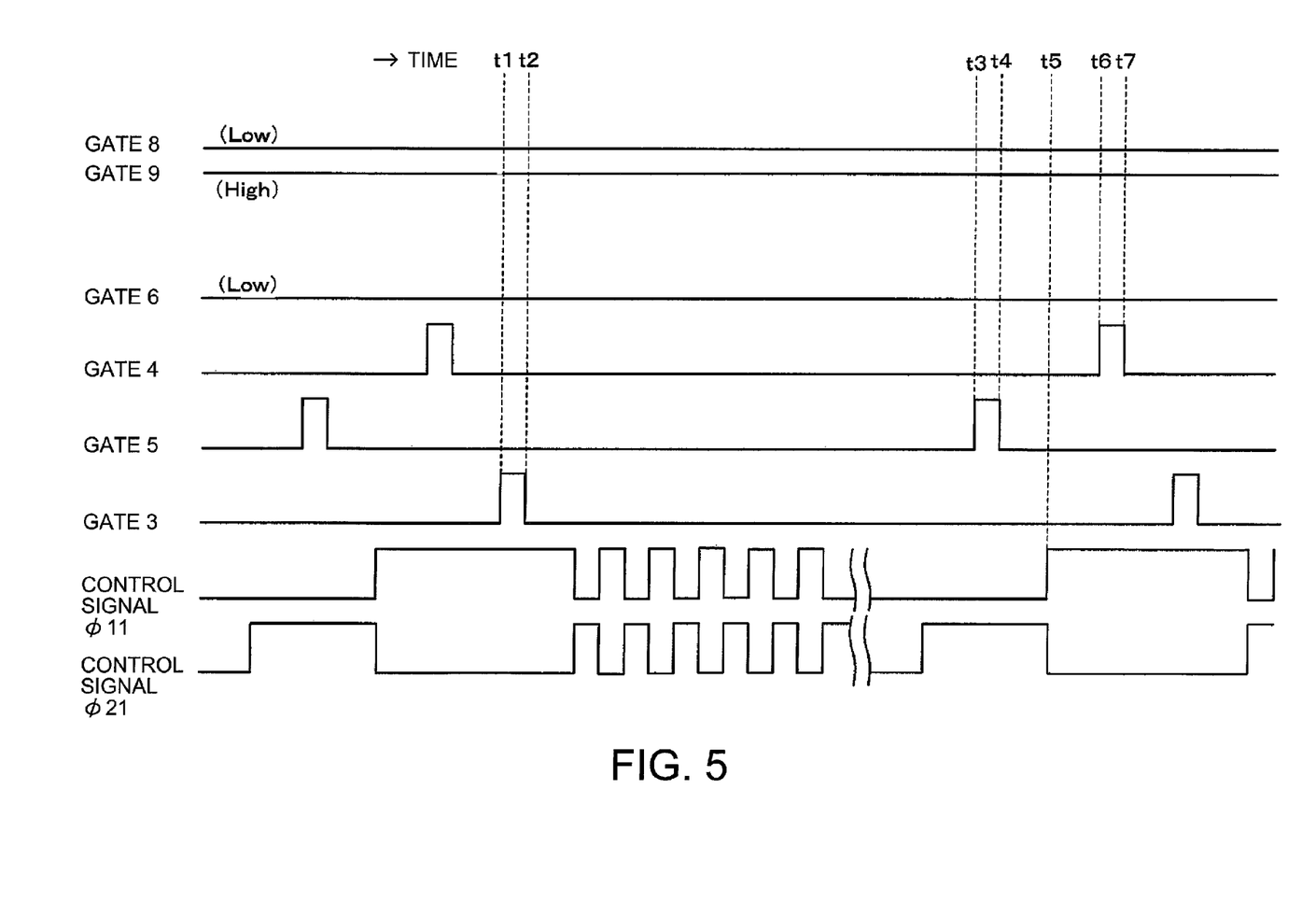
FIG. 5 is a waveform diagram for explaining a charge transferring operation for acquiring a half resolution by the solid-state imaging device.

FIG. 5 shows waveforms of signals applied to the gates 3 to 6, 8, and 9 during an operation for half a resolution. Specifically, FIG. 5 shows portions of the total waveforms which are repeated cyclically. The portions correspond to a period including one operation cycle of charge transfer.

In the case of the operation for half the resolution, the gate 8 and the gates 6 of FIG. 1 are at a "low" level continuously, and the gate 9 of FIG. 1 is at a "high" level continuously.

At a time t1, when the gate 3 is at a "high" level, the charges accumulated in each pixel of the first pixel row 1 move to the gate 3.

At a time t2, when the gate 3 is at a "low" level, the charges which move to the gate 3 are transferred to each pixel of the second pixel row 2, and as a result, are added to the charges accumulated in each pixel of the second pixel row 2.

At a time t3, when the gates 5 are at a "high" level, the charges of the even-numbered pixels of the second pixel row 2 move to the gates 5, respectively.

At a time t4, when the gates 5 are at a "low" level, the charges which move to the gates 5 are transferred to the accumulation portions φ2 of the CCD register 13.

At a time t5, when a control signal φ11 which is provided to accumulation portions φ1 is at a "high" level and a control signal φ21 which is provided to accumulation portions φ2 is at a "low" level, the charges of the accumulation portions φ2 of the CCD register 13 are transferred to the accumulation portions φ1 on adjacent positions, respectively.

At a time t6, when the gates 4 are at a "high" level, the charges of the odd-numbered pixels of the second pixel row 2 move to the gates 4, respectively.

At a time t7, when the gates 4 are at a "low" level, the charges moved to the gates 4 are transferred to the accumulation portions φ1 of the CCD register 13, respectively and are added to the charges transferred from the accumulation portions φ2.

As a result, a series of vertical movement of the charges is terminated.

Figure 6:
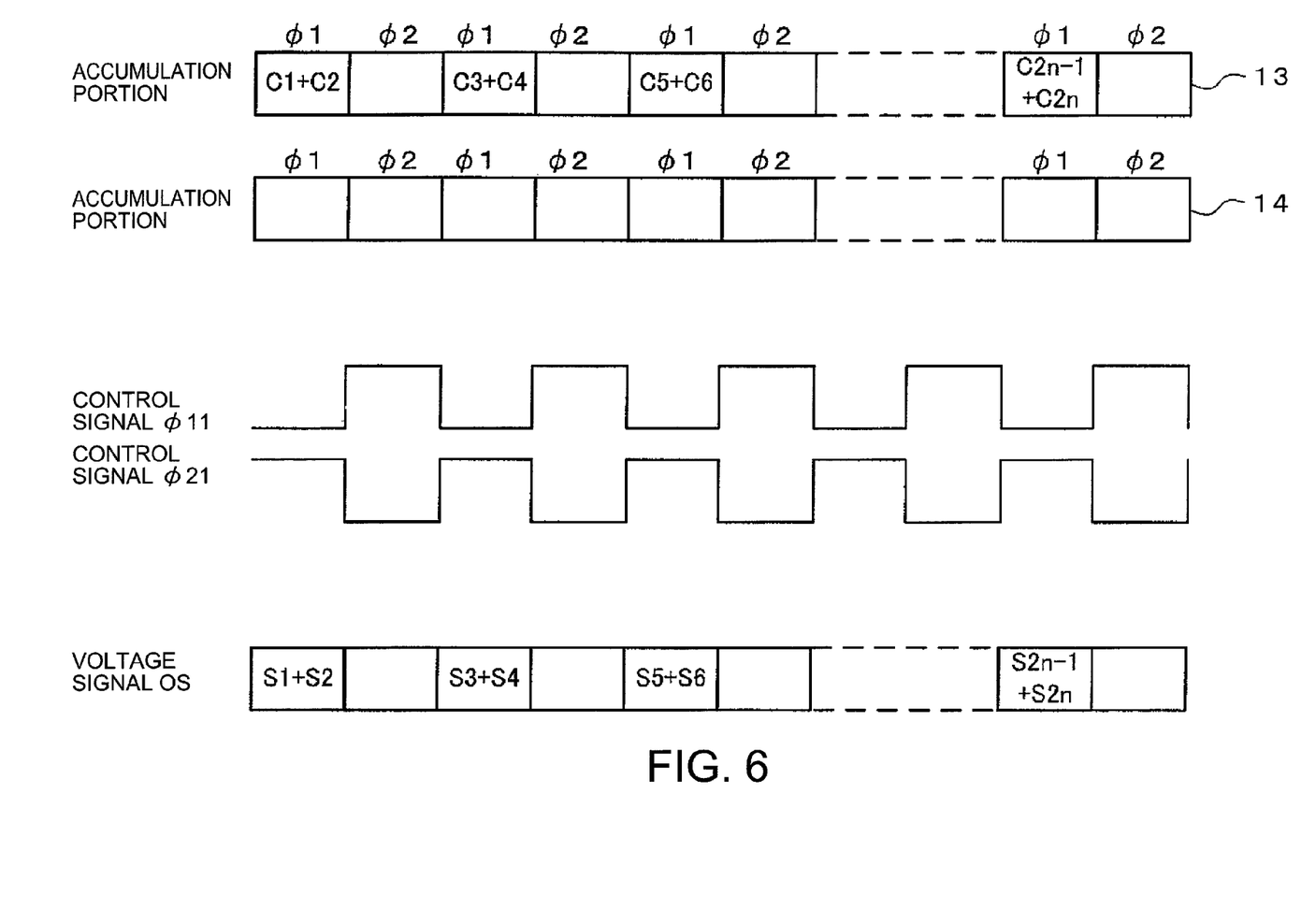
FIG. 6 is a diagram for explaining operations of the first and second CCD registers and the output portion which are performed when the half resolution is acquired by the solid-state imaging device.

FIG. 6 shows a relationship among an accumulation state of the charges accumulated in the CCD registers 13, 14, the control signals φ11, φ21 and a voltage signal OS output from the output portion 7 when the vertical movement of the charges is terminated.

In the operation, the charges are accumulated in the CCD register 13 but are not accumulated in the CCD register 14.

In the CCD register 13, the charges C1+C2, C3+C4, ..., C2n−1+C2n are accumulated in the accumulation portions φ1, respectively. "n" is a positive integer.

Accordingly, the charges accumulated in each accumulation portion φ1 are quadruple of the charges accumulated in each pixel of the first and the second pixel rows 1, 2. As a result, the sensitivity can become quadrupled of that of a single pixel.

(Operation for Adjusting Sensitivity of First Pixel Row)

Figure 7:
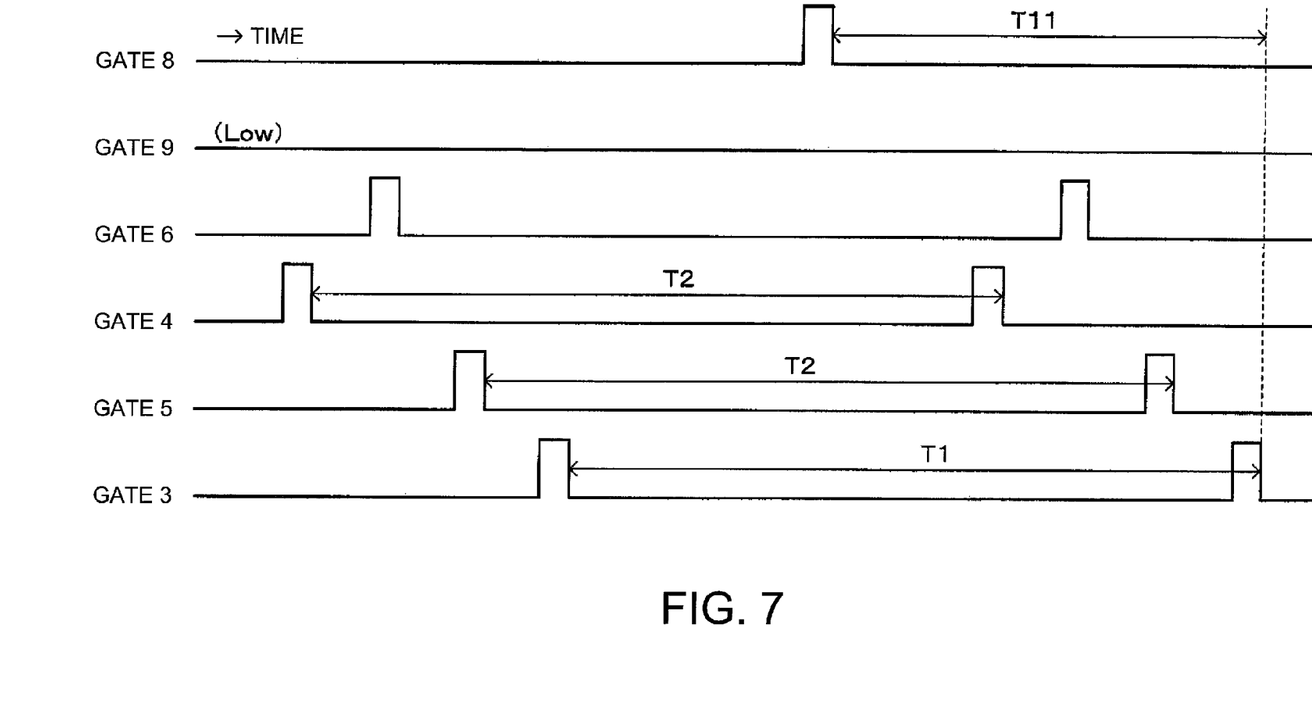
FIG. 7 is a waveform diagram for explaining a sensitivity adjusting operation of a first pixel row of the solid-state imaging device.

FIG. 7 shows signal waveforms which are applied to the gates 3 to 6, 8 and 9 during an operation for adjusting the sensitivity of the first pixel row 1. In this case, a normal resolution is acquired.

In the operation, while the gate 3 is at a "low" level, the gate 8 changes to a "high" level. Charges which are accumulated in each pixel of the first pixel row 1 until the change of the level of the gate 8 are drained to the first drain portion 10. The period of charge accumulation in each pixel of the first pixel row 1 is a period T11 which ranges after a falling of the level of the gate 8 to a "low" level until a subsequent falling of the level of the gate 3 to a "low" level.

Accordingly, the sensitivity of each pixel of the first pixel row 1 is lowered to T11/T1 as compared with a case in which the charges are fully accumulated during the period T1 (a falling cycle) ranging from a falling of the level of the gate 3 to a subsequent falling of the level of the gate 3.

The falling cycle of the gates 4 which is a period of charge accumulation in the odd-numbered pixels of the second pixel row 2, and the falling cycle of the gates 5 which is a period of charge accumulation in the even-numbered pixels are set to T2 commonly. T2 is set to be equal to T1 (T2=T1). The sensitivity of each pixel of the first pixel row 1 is expressed as "T11/T2" in a case where the sensitivity of each pixel of the second pixel row 2 is one-fold.

Accordingly, the sensitivity which is obtained by adding charges of each pixel of the first pixel row 1 and charges of each pixel of the second pixel row 2 according to a time delay integration (TDI) operation is expressed as "1+T11/T2". The sensitivity obtained through a TDI operation in this case is a value smaller than twofold.

The sensitivity can be easily changed by changing the timing when the level of the gate 8 is changed to a "high" level or the period TH.

(Operation for Adjusting Sensitivity of Second Pixel Row)

Figure 8:
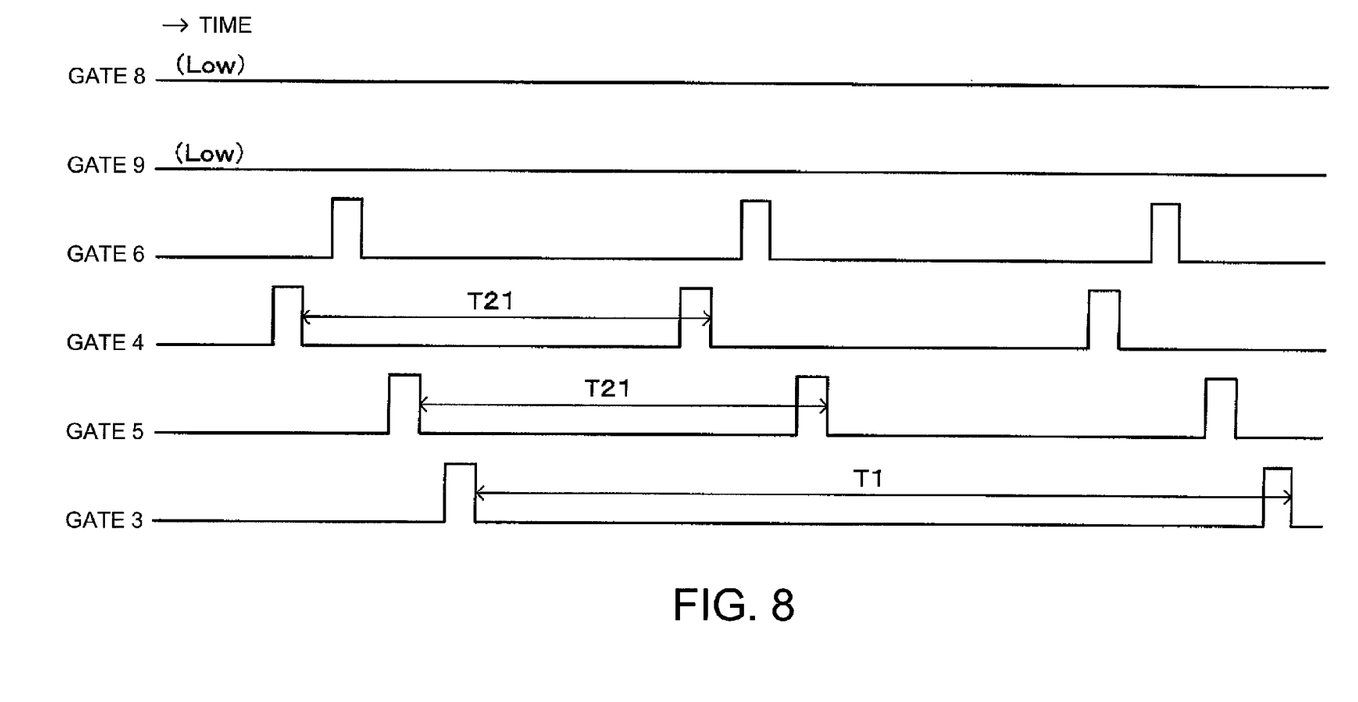
FIG. 8 is a waveform diagram for explaining a sensitivity adjusting operation of a second pixel row of the solid-state imaging device.

FIG. 8 shows waveforms of signals applied to the gates 3 to 6, 8 and 9 in the operation for adjusting the sensitivity of the second pixel row 2. In this case, a normal resolution is obtained.

The falling cycle of the gates 4 which is a period of charge accumulation in the odd-numbered pixels of the second pixel row 2, and the falling cycle of the gates 5 which is a period of charge accumulation in the even-numbered pixels are set to T21, commonly. T21 is set to be shorter than the falling cycle T1 of the gate 3 which is the period of charge accumulation of each pixel of the first pixel row 1, i.e., T21<T1.

With the setting, the sensitivity of each pixel of the second pixel row 2 is expressed as "T21/T1" in a case where the sensitivity of each pixel of the first pixel row 1 is set as one-fold.

Accordingly, the sensitivity which is obtained by adding the charges of each pixel of the first pixel row 1 and the charges of each pixel of the second pixel row 2 in the TDI operation is expressed as "1+T21/T1". In this case, the sensitivity acquired through TDI operation is a value smaller than twofold.

The sensitivity can be easily changed by changing the falling cycles of the gates 4 and the gates 5.

According to the solid-state imaging devices of the embodiments, the sensitivity can be set to be lower than twofold in the TDI operation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device, comprising:
a first pixel row including pixels which convert incident light photoelectrically and accumulate acquired charges;
a second pixel row including pixels which convert incident light photoelectrically and accumulate acquired charges;
a first transfer gate arranged between the first pixel row and the second pixel row;
second transfer gates arranged adjacently to odd-numbered ones of the pixels of the second pixel row, respectively;
third transfer gates arranged adjacently to even-numbered ones of the pixels of the second pixel row, the third transfer gates being provided alternately with the second transfer gates, respectively;
a first CCD register arranged adjacently to the second transfer gates and third transfer gates provided alternately, the a first CCD register accumulating transferred charges;
fourth transfer gates arranged adjacently to odd-numbered accumulation gates of the first CCD register;

a second CCD register arranged adjacently to the fourth transfer gates, the a second CCD register accumulating transferred charges;

an output portion which converts into a voltage signal charges transferred in a row direction in the first CCD register and the second CCD register, the output portion outputting the converted voltage signal;

a clear gate which controls draining of the charges accumulated in the first pixel row to a first drain portion; and a switch gate which controls draining of the charges transferred in the row direction in the second CCD register to a second drain portion.

2. The device according to claim 1, wherein the pixels of the second pixel row accumulate the charges from the pixels of the first pixel row transferred via the first transfer gate, respectively, and adds the accumulated charges and the charges acquired by converting light incident in the second pixel row photoelectrically.

3. The device according to claim 2, wherein:

the first CCD register accumulates charges transferred from the even-numbered pixels of the second pixel row via the third transfer gates, respectively and then transfers the accumulated charges in the row direction, the second CCD register accumulates charges transferred from the odd-numbered pixels of the second pixel row via the second transfer gates, odd-numbered accumulation gates of the first CCD register and the fourth transfer gates, and then transfers the accumulated charges in the row direction, and the output portion alternately converts the transferred charges from the second CCD register and the transferred charges from the first CCD register into the voltage signal, and outputs the converted voltage signal.

4. The device according to claim 2, wherein, in a state that the fourth transfer gates are closed and the switch gate is opened, the first CCD register transfers the charged which are transferred from the even-numbered pixels of the second pixel row to even-numbered accumulation gates of the first CCD register via the third transfer gates to the odd-numbered adjacent accumulation gates, the first CCD register adding the transferred charges and the charges transferred from the odd-numbered pixels of the second pixel row to the odd-numbered accumulation gates of the first CCD register via the second transfer gate, the first CCD register transferring the added charges in the row direction, and the output portion converts the transfer charges from the first CCD register into the voltage signal and outputs the converted voltage signal.

5. The device according to claim 2, wherein the period of charge accumulation in the first pixel row is controlled by controlling a timing of making the clear gate conductive electrically so that the sensitivity of the first pixel row is adjusted.

6. The device according to claim 2, wherein the period of charge accumulation in the second pixel row is controlled by controlling the timings of making the second and the third transfer gates conductive electrically so that the sensitivity of the second pixel row is adjusted.

7. The device according to claim 5, wherein, the clear gate is changed to a high level during a low level of the first transfer gate so that the charges accumulated in the first pixel row until the change of the level of the first transfer gate are drained to the first drain gate, and the period ranging from a falling of the clear gate to a low level after the drainage to a subsequent falling of the first transfer gate to the low level is set as a period for accumulating charges in the first pixel row and the sensitivity is lowered by adjusting the period.

8. The device according to claim 6, wherein a falling cycle of the second transfer gates and a falling cycle of the third transfer gates are commonly set as the period of charge accumulation in the second pixel row and are set to be shorter than a falling cycle of the first transfer gate which is the period of charge accumulation of the first pixel row so that the sensitivity is lowered.

9. The device according to claim 5, wherein the sensitivity of the first pixel row obtained through the adjustment is a value smaller than twofold.

10. The device according to claim 6, wherein the sensitivity of the first pixel row after the drainage through the adjustment is a value smaller than twofold.

* * * * *